(12) United States Patent
Klimas et al.

(10) Patent No.: US 11,969,817 B2
(45) Date of Patent: Apr. 30, 2024

(54) DEVICE FOR DETERMINING A STATUS OF AN ULTRASONIC WELDING PROCESS

(71) Applicant: Lisa Draexlmaier GmbH, Vilsbiburg (DE)

(72) Inventors: Felix Klimas, Langquaid (DE); Thomas Herzing, Landshut (DE); Lutz Lehmann, Landshut (DE); Daniel Zemann, Landshut (DE); Gabriel Ertz, Hannover (DE); Jens Twiefel, Hannover (DE); Joerg Wallaschek, Hannover (DE); Michael Weinstein, Hannover (DE)

(73) Assignee: LISA DRAEXLMAIER GMBH, Vilsbiburg (DE)

(*) Notice: Subject to any disclaimer, the term of this patent is extended or adjusted under 35 U.S.C. 154(b) by 137 days.

(21) Appl. No.: 17/497,513

(22) Filed: Oct. 8, 2021

(65) Prior Publication Data
US 2022/0023967 A1     Jan. 27, 2022

Related U.S. Application Data

(63) Continuation of application No. PCT/EP2020/059137, filed on Mar. 31, 2020.

(30) Foreign Application Priority Data

Apr. 9, 2019   (DE) .................... 102019109262.0

(51) Int. Cl.
 *B23K 20/10*   (2006.01)
 *B23K 31/12*   (2006.01)

(52) U.S. Cl.
 CPC ............ *B23K 20/10* (2013.01); *B23K 31/125* (2013.01)

(58) Field of Classification Search
 CPC .......... B23K 20/10–106; B23K 31/125; B23K 1/06; B23K 20/004–007
 (Continued)

(56) References Cited

U.S. PATENT DOCUMENTS

| | | | | |
|---|---|---|---|---|
| 6,039,234 A | * | 3/2000 | Toner ................... | B23K 20/004 228/8 |
| 6,543,668 B1 | | 4/2003 | Fujii et al. | |

(Continued)

FOREIGN PATENT DOCUMENTS

| | | | |
|---|---|---|---|
| CN | 108247192 A | * | 7/2018 |
| DE | 4206584 | | 9/1993 |

(Continued)

OTHER PUBLICATIONS

International Search Report for International Application PCT/EP2020/059137, dated Jul. 3, 2020.

*Primary Examiner* — Kiley S Stoner
(74) *Attorney, Agent, or Firm* — Burris Law, PLLC (57) ABSTRACT

A device to determine a state of an ultrasound welding process, which can be carried out using an ultrasound tool, includes a sensor element and an evaluation unit. The sensor element is configured to detect an electrical control signal from an ultrasound tool. The evaluation unit is configured to determine a signal property of the control signal and to determine the status of the ultrasound welding process based on a reference signal profile and on the determined signal property. An assembly with an ultrasound welding system and a method are also included.

12 Claims, 5 Drawing Sheets

(58) Field of Classification Search
USPC .......... 228/1.1, 4.5, 904, 110.1, 180.5, 8–12, 228/102–104
See application file for complete search history.

(56) References Cited

U.S. PATENT DOCUMENTS

| | | | | |
|---|---|---|---|---|
| 6,667,625 | B1 * | 12/2003 | Miller ..................... | H01L 24/85 228/104 |
| 7,845,543 | B1 * | 12/2010 | Yung ..................... | B23K 3/087 228/103 |
| 2003/0218050 | A1 * | 11/2003 | Kanemoto .............. | H01L 24/78 228/103 |
| 2007/0084539 | A1 * | 4/2007 | Junker ................ | B23K 20/1205 228/110.1 |
| 2008/0006674 | A1 * | 1/2008 | Chan ....................... | H01L 24/78 228/110.1 |
| 2008/0099532 | A1 * | 5/2008 | Nakao ..................... | H01L 24/85 228/1.1 |
| 2009/0013786 | A1 * | 1/2009 | Gassert ............... | B29C 66/9516 73/579 |
| 2010/0280646 | A1 | 11/2010 | Hesse et al. | |
| 2014/0367020 | A1 * | 12/2014 | Klinstein .............. | B29C 66/932 156/64 |
| 2016/0153880 | A1 * | 6/2016 | Song ...................... | B23K 20/10 73/827 |

FOREIGN PATENT DOCUMENTS

| | | | |
|---|---|---|---|
| DE | 4321874 | 1/1995 | |
| DE | 10110048 | 9/2002 | |
| DE | 102008029769 A1 * | 12/2009 | ........... B23K 20/106 |
| DE | 102009003312 A1 * | 4/2010 | ........... B23K 20/002 |
| DE | 102013222876 | 5/2014 | |
| DE | 102013225643 | 6/2015 | |
| DE | 102014116474 | 5/2016 | |
| DE | 102019106694 A1 * | 9/2020 | ............ B23K 20/10 |
| DE | 102019109262 A1 * | 10/2020 | ............ B23K 20/10 |
| JP | 06045412 A * | 2/1994 | ............ H01L 24/78 |
| JP | 10308407 A * | 11/1998 | ............ B23K 20/004 |
| JP | 2001223238 A * | 8/2001 | ............ B23K 20/10 |
| KR | 20160118364 A * | 10/2016 | |
| WO | WO-9408778 A1 * | 4/1994 | ............... B06B 1/14 |
| WO | WO-0102125 A1 * | 1/2001 | ............ B23K 31/125 |
| WO | WO-2016103886 A1 * | 6/2016 | ............ B23K 20/002 |
| WO | WO-2020207863 A1 * | 10/2020 | ............ B23K 20/10 |
| WO | WO-2020207865 A1 * | 10/2020 | ............ B23K 20/10 |

* cited by examiner

DEVICE FOR DETERMINING A STATUS OF AN ULTRASONIC WELDING PROCESS

CROSS-REFERENCE TO RELATED APPLICATIONS

This application is a continuation of International Application No. PCT/EP2020/059137, filed on Mar. 31, 2020, which claims priority to and the benefit of DE 102019109262.0, filed on Apr. 9, 2019. The disclosures of the above applications are incorporated herein by reference.

FIELD

The present disclosure relates to a device to determine a state of an ultrasound welding process, to an assembly and to a method.

BACKGROUND

The statements in this section merely provide background information related to the present disclosure and may not constitute prior art.

Ultrasound welding processes for metals use ultrasound tools (or also US vibration systems) for welding of different metal pairings. This process is fast, energy-efficient and reliable.

SUMMARY

This section provides a general summary of the disclosure and is not a comprehensive disclosure of its full scope or all of its features.

The present disclosure provides an advantageous concept for determining a state of an ultrasonic weld process.

During the weld process there are various phases of cleaning-, diffusion- and bonding-processes, which can be assessed, for example, via impedance-, harmonic-distortion-, or proportion-determined of certain higher-harmonic frequency-component profiles. Indicators can be derived therefrom that can be used to assess the process quality.

According to a first aspect, the present disclosure provides a device for determining a state of an ultrasound welding process, which can be carried out using an ultrasound tool comprising a sensor element, which is designed to detect an electrical control signal of the ultrasound tool, and an evaluation unit which is designed to determine a signal property of the control signal and to determine a state of the ultrasound welding process based on a reference signal profile and the determined signal property.

The reference signal profile can be pre-stored in a memory. The evaluation unit can be designed to read out the reference signal profile from the memory. The electrical control signal serves for controlling the ultrasound tool in order to execute the ultrasound welding process. Using the control signal, a generator can control the ultrasound tool.

Accordingly, the present disclosure relates to a system-independent system- and process-diagnosis system for ultrasound processes that can be operated in a system-independent manner and that is "invisible" to the generator from an electrical point of view. This allows both a characterizing of the vibration system and an assessment of the welding process, without having to interfere in the welding process, and this occurs independently of the system type.

One function is the observing of the process and the detecting of the electrical terminal values of current and voltage that are applied to the ultrasound vibrator during the welding, without thereby affecting the weld. During the welding, the system is not visible to the generator.

The measured value measured during measurement of the electrical control signal can be a variable that is dependent on time. It is advantageous to record the measured value as dependent on time, since often welds performed under different conditions do not differ significantly in their average value, or in an individual Fourier transform across the entire weld process, but rather differ only in the shape of their curve when the physical quantities are plotted against time.

The use of a Fourier analysis can comprise a short-term Fourier analysis, from which the temporal relationships of the amplitude, frequency or other quantities can be determined. Individual window sections of the short-term Fourier analysis can refer back to a suitable window function, in particular flattop window in the calculation of an amplitude, a rectangular window in the calculation of a frequency or of a phase. Zero padding and interpolation can also be applied, in particular in the calculation of a frequency in a short-term Fourier analysis with small window sizes.

In one form, the device comprises a first connector which is configured to be connected to an output of an ultrasound generator. A second connector is configured to be connected to a signal input of the ultrasound tool, and a signal path electrically connects the first connector and the second connector, wherein the sensor element is designed to measure the electrical control signal along the signal path in a non-invasive manner.

This can represent an intelligent interconnection system. This is implemented between generator and converter and includes sensors for measuring the current and voltage.

The curve parameters of harmonic distortion, form factor and peak factor can be used to describe the intensity distribution of the various harmonics occurring in one of the measured vibrations. Taken together, these factors characterize the curve shape of a periodic quantity.

Ultrasound welding systems often use the frequency as a control variable for their control circuit. This quantity is adjusted such that the control variable is held constant or is changed during the process in a targeted manner. Typical control variables are the active power introduced in the system, deflection of the sonotrode or core admittance (estimated from the electrical values) or the phase difference between current and voltage. This controlling is the reason why, in the example of friction-reducing contamination due to grease, for example, hand cream, the operating frequency is set to a lower value by the generator, than is the case for clean samples. To determine what effect certain weld settings and weld conditions have on the control variable frequency, the frequency response of the admittance and of the core admittance can be observed. Due to reduced friction in the joining zone, the resonance (determined from the mechanical series resonant circuit) is shifted toward lower frequencies. Thus if the starting value of the frequency lies above the resonance, the frequency in the case of such contaminated joining parts must be adjusted to lower values than for non-prepared parts in order to adjust the deflection to the same target value.

During the controlling of the system, the deflection at the sonotrode need not be taken into account in the control circuit. When adjusting the deflection to a target value, this value can be estimated via the electrical values. If the mechanical values are measured in addition to the electrical values, then cross-domain values such as the core admittance can be calculated. The value of the core admittance is obtained from the velocity amplitude/voltage amplitude. A synchronization of the electrical and mechanical measurements may be desired in order to determine the phase of the core admittance.

In one form, the sensor element comprises a voltage scanning head to measure a voltage signal and/or comprises a current transformer to measure a current signal.

In one form, the device comprises a switching element which is disposed in the signal path and is designed to interrupt the signal path to electrically separate the first connection from the second connection, and a signal generator which is designed to generate a control signal for the ultrasound tool and to control the ultrasound tool when the switching element interrupts the signal path.

The signal generator can be a small-signal frequency generator with integrated amplifier. The switching element can be a relay.

An additional function of the device is that a small-signal controlling of the ultrasound vibrator can occur between the welds, during the idle state of the welding system, during which time the electrical terminal values of current and voltage are also measured (measurement of impedance). The replacement parameters can be determined from the impedance measurement and used to characterize the US vibrator. The small-signal controlling for measurement of impedance can be conducted as a modified sine wave (also called "frequency sweep") at a frequency between ±2 kHz of the operating frequency. During the small-signal controlling the ultrasound vibrator is decoupled from the generator via a relay circuit and is coupled to an amplifier integrated into the interconnection system.

The direct analysis of the system state is affected by a measuring of the frequency response of the admittance. In this regard, the non-loaded vibrating system is excited at a constant voltage at different frequencies, and the system response is measured in the form of the current (i.e., by a small-voltage sweep, the frequency-dependent admittance of the piezoactuator with the vibration system as load). The frequency-dependent admittance of the non-loaded vibration system results from the relationship of current response and voltage. The state of the vibration system can be characterized with this frequency response. Since the vibration system is composed of one parallel and one series resonant circuit, a resonance and an anti-resonance occur in the range of the operating frequency. The frequencies, where they occur, their spacing, their width and values, the phase in the frequency range between them—all these quantities provide information about the state of the vibration system. A non-functional piezoactuator has, for example, a smaller frequency interval between resonance and anti-resonance. An improperly supported system will experience friction losses, for example, which are recognizable in the frequency response.

In one form, the switching element is designed to interrupt the signal path when the sensor device detects that the ultrasound generator is not sending any control signal to the ultrasound tool. Thus, an additional measuring can occur during the pauses in the controlling with the signal generator as ultrasound source.

In one form, the signal generator is designed to generate the control signal for the ultrasound tool using a small-signal controller. A simplified calculation of the needed parameters can be effected using a small-signal control.

In one form, the sensor device is designed to measure an electrical signal on the signal path, while the signal generator of the device controls the ultrasound tool along the signal path. This can contribute to obtaining a reference profile since the signal generator can provide predefined values.

In one form, the evaluation device is designed to determine replacement parameters based on the measured electrical signal, which was measured while the signal generator of the device controlled the ultrasound tool along the signal path. This can cause an updating of the model using the small signal control.

The vibration system can be modeled by an electromechanical equivalent circuit. By a comparison of the system response of this equivalent circuit with the measured frequency response, the replacement parameters of the circuit can be determined. The frequency response of ultrasound welding systems can be very closely approximated with a model composed of four replacement parameters. These parameters are capacitance of the piezoactuator, capacitance, inductance and resistance of the mechanical vibrator (here the mechanical parameters of inertia, rigidity and damping are converted into the analogous electrical parameters of capacitance, inductance and resistance as they go into the impedance which describes the load on the generator). With this method, changes to the vibration system, in particular gradual changes of the piezoactuator, are detectable.

These replacement parameters can also be calculated for the case of a vibration system under load, that is, when the sonotrode is pressed by a normal force onto the joining parts and thus undergoes additional damping. It is also possible to measure a frequency response during the welding process by the stimulus voltage being significantly smaller than the weld voltage which is in the kilovolt range, and thus does not disturb the weld process, but rather merely overlaps it. Provided the instantaneous frequency of the measurement of frequency response is not too close to the instantaneous operating frequency, then in the measurement of current the portion of the instantaneous frequency can be filtered out of the measurement of frequency response. In this regard, the evaluation unit can use a Fourier analysis.

In one form, the signal generator is designed to generate the control signal based on an operating signal of the ultrasound generator, in particular at a frequency between ±2 kHz of the operating frequency of the ultrasound generator.

In one form, the device comprises a discharging circuit element which is connected electrically to the signal path and is designed to short-circuit the ultrasound tool in a conducting state so that a residual charge in the ultrasound tool can flow off.

According to a second aspect, the present disclosure provides an assembly including an ultrasound welding system and a device according to the first aspect, wherein the device is connected between an ultrasound generator of the ultrasound welding system and a converter of the ultrasound welding system.

According to a third aspect, the present disclosure provides a method for determining a state of an ultrasound welding process, comprising:

measuring of an electrical control signal of an ultrasound tool by a sensor element;

determining a signal property of the control signal by an evaluation element; and determining a state of the ultrasound welding process based on a reference signal profile and on the signal property determined by the evaluation element.

In one form, the measurement is performed during a weld process. This can allow a monitoring of the weld process.

In one form, the method comprises a separating of an ultrasound generator from the ultrasound tool by a switching element.

In one form, the method comprises a generating of a control signal by a signal generator and controlling of the ultrasound tool when the ultrasound generator is disconnected from the ultrasound tool.

In one form the method comprises a determining of a replacement parameter for the welding system based on a particular state of the ultrasound welding process based on the generated control signal.

In this manner reference values can be generated to determine the measured curves, and a model according to which the signal generator and the evaluation unit operate can be improved.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
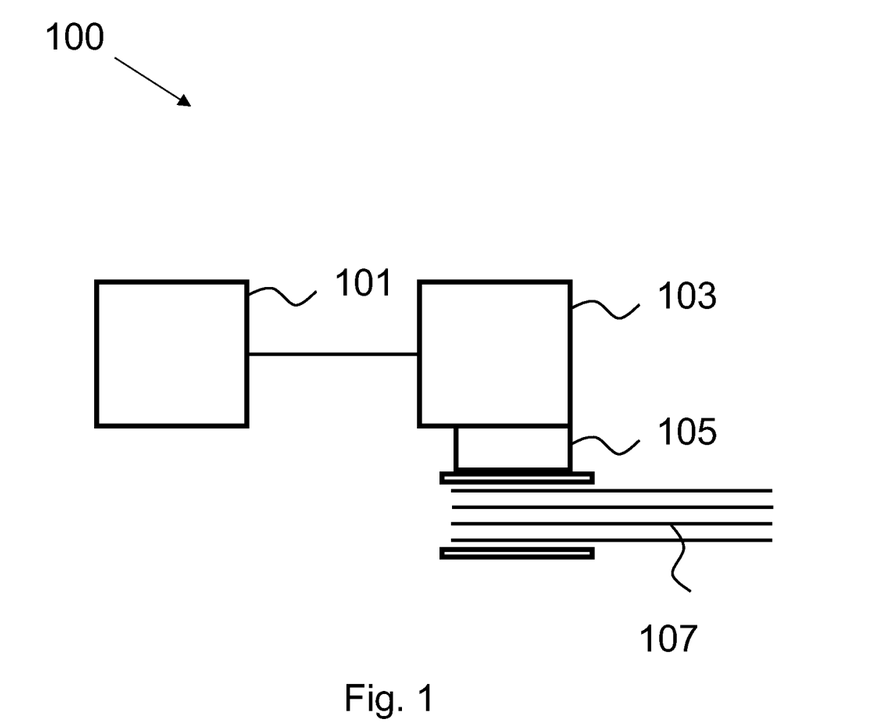
FIG. 1 shows a schematic representation of an ultrasound welding system, according to the teachings of the present disclosure.

FIG. 1 shows a schematic representation of an ultrasound welding system 100 according to the present disclosure.

The ultrasound welding system 100 comprises a vibration generator 103, that is, the converter of a sonotrode 105, i.e., the oscillating part which is in contact with the weld material 107, and possibly one or more intermediate items, the so-called "boosters" which serve for amplitude transformation or for mounting. The converter usually consists of a stack of piezoelectric ceramic actuators which are electrically contacted and preloaded via supplemental components.

The generator 101 is connected to the converter and usually generates a sinusoidal alternating voltage in the ultrasound range (20-100 kHz), which is converted by the piezoelectric ceramics into a mechanical vibration of the same frequency. The design of the converter, of the booster and of the sonotrode 105 is configured such that after the half-wave synthesis they are tuned to the frequency generated by the generator 101 and they vibrate at or near the resonance frequency of an eigenmode. In the resonant state the entire US vibration system is operating optimally with regard to energy.

Figure 2A:
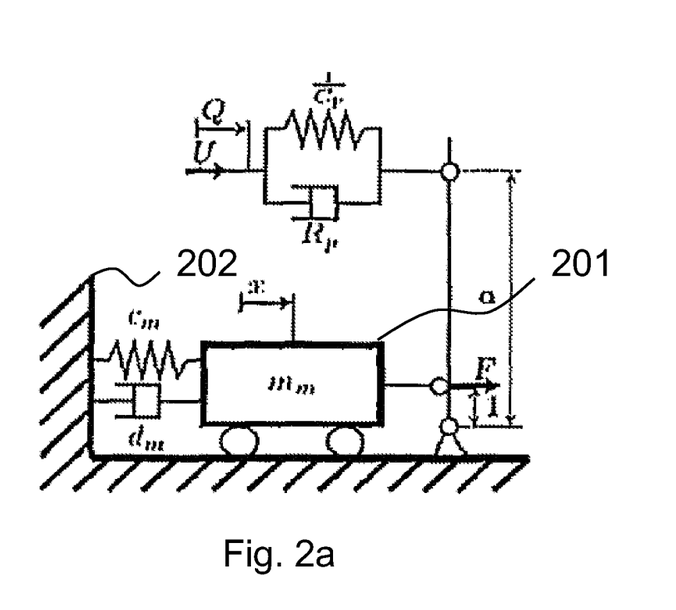
FIG. 2a shows a mechanical equivalent circuit of an ultrasound welding system, according to the teachings of the present disclosure.

The electromechanical US vibrating system can be depicted as an equivalent schematic for the operation in resonance, see FIG. 2a, and allows the derivation of replacement parameters for characterizing the US vibration system: a cart 201 with mass $m_m$ is coupled via a spring $c_m$ and a damper $d_m$ to the environment. A harmonic force impinges on the right side. These components represent the mechanical components of the ultrasound vibrator, which moves in resonance with the displacement x.

In this regard, the quantities with the index m represent modal quantities of an excited mode. The mechanical domain is coupled to the electrical domain of the piezoactuator via a transformer a. Here Cp is the capacitance of the piezoactuator and Rp represents the loss resistance of the piezoactuator, which is usually negligible, however, and can be assumed as a simplification to be Rp=0. In the mechanical equivalent schematic, via the transformer a, the electrical voltage U and the charge Q are directly proportional to the mechanical force F and the mechanical displacement x.

Thus, it is evident from the schematic that an alternating voltage U(t) applied to the piezoactuator leads to a mechanical vibration with the displacement x(t).

Figure 2B:
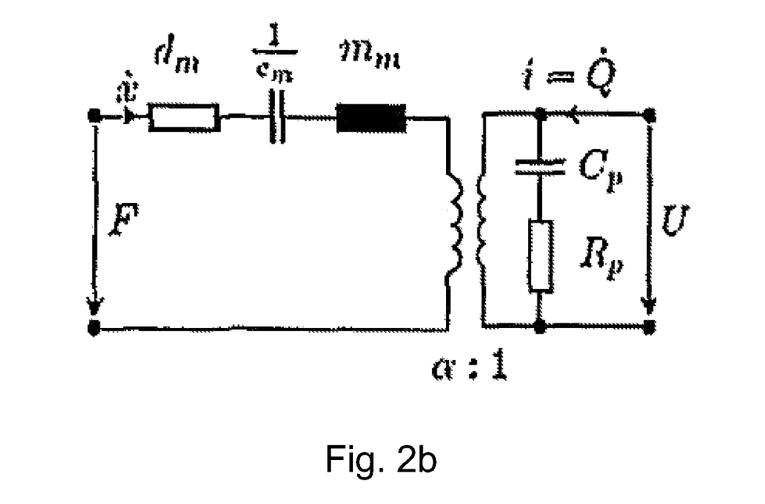
FIG. 2b shows an electrical equivalent circuit of the mechanical equivalent circuit from FIG. 2a, according to the teachings of the present disclosure.

Instead of the mechanical replacement parameters, the ultrasound vibrator with an eigenmode can also be represented in the form of an electrical equivalent schematic; see FIG. 2b. Here the modal mass $m_m$ corresponds to an inductance, the damper $d_m$ corresponds to a resistance, the transformer a corresponds to a transformer and the rigidity $c_m$ corresponds to the reciprocal of a capacitance. Here the speed of the mechanical vibration i is expressed as an electrical quantity proportional to the current.

Figure 2C:
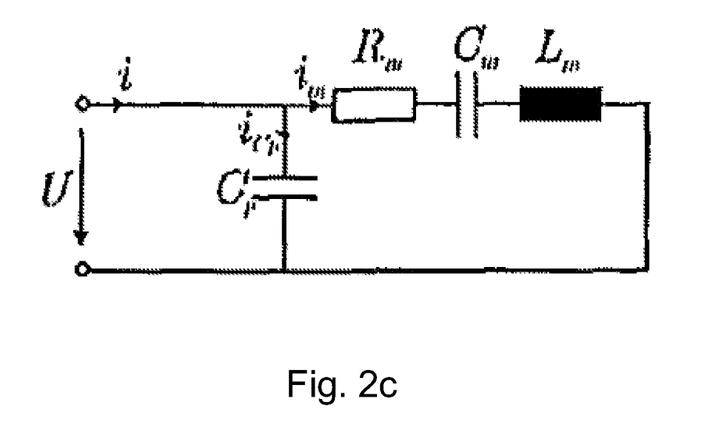
FIG. 2c shows an electrical small-signal equivalent circuit of the mechanical equivalent circuit from FIG. 2a, according to the teachings of the present disclosure.

Now if it is assumed that the transformer factor a is constant, then the electrical equivalent schematic can be further simplified and expressed by the quantities $R_m$, $C_m$ and $L_m$; see FIG. 2c.

Industrially the electrical replacement parameters can also be used to characterize the vibration unit.

The vibration system is used for the welding process as follows: the oscillating motion of the sonotrode 105 is transferred via the contact surfaces of the sonotrode 105 to the joining partners to be welded, that is, to the weld material 107. This material can be, for example, a cable composed of filaments and a contact part. The oscillating motion of the sonotrode 105 is transferred onto the filaments so that they move relative to the contact part fixed by a downholder. The fast relative motion of the joining partners initially provides a cleaning of the surfaces, so that oxide layers are removed. Due to the ultrasound vibration, an accelerated diffusion process occurs between the process partners, so that depending on the application, within a few seconds a cold-welded, materially-bonded connection of the joining partners occurs.

Figure 3:
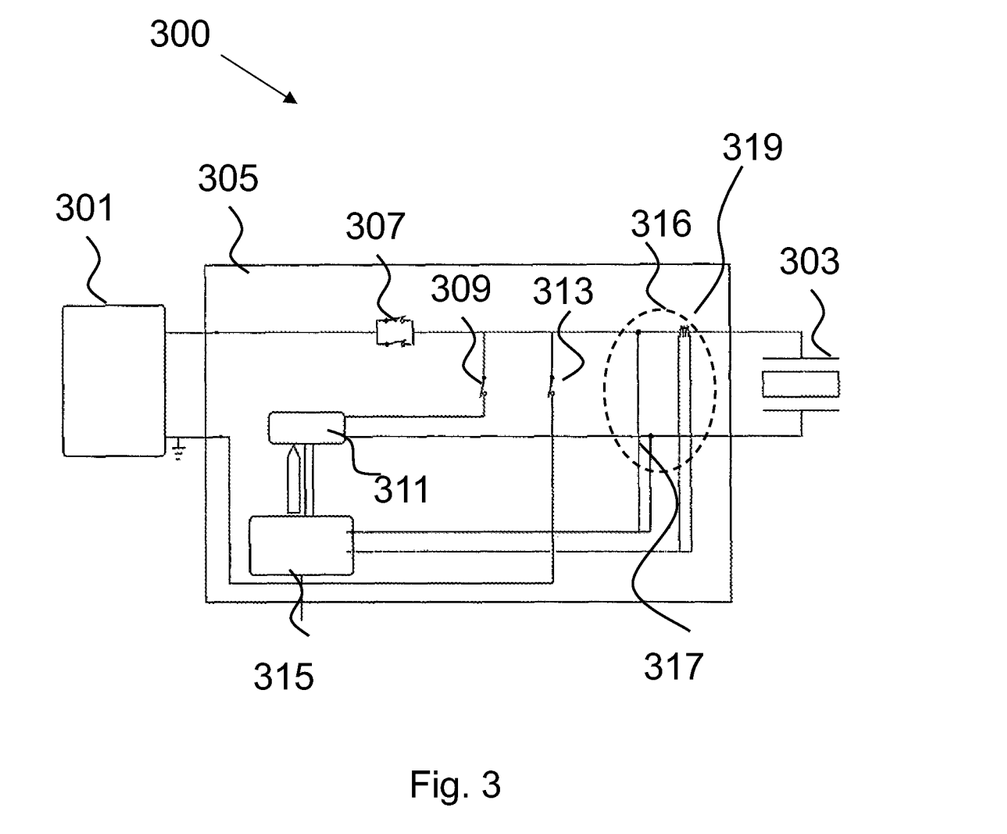
FIG. 3 shows a schematic representation of an ultrasound welding system according to one form of the present disclosure.

FIG. 3 depicts a schematic representation of an ultrasound welding system 300 according to one form of the present disclosure. The ultrasound welding system 300 comprises an ultrasound generator 301 and an ultrasound tool 303. A device 305 is connected between the ultrasound generator 301 and the ultrasound tool 303. The device 305 comprises a relay circuit with a switching element 307 to disconnect a positive path between the ultrasound generator 301 and the ultrasound tool 303.

The direct analysis uses a device 305 which includes an additional voltage source in addition to the ultrasound generator 301, which provides the voltage for the frequency response (sweep). High voltage relays are additionally desired as switches in order to be able excite the piezoactuator separately from the ultrasound generator 301. In order to be able to use such monitoring in manufacturing, the device should be able to detect the interval between welds in order to perform the measurement at the suitable point in time by the connection between ultrasound generator 301 and piezoactuator being broken and the piezoactuator instead being excited by the voltage source of the device. In another form, the system can be integrated into the control- and regulation-circuit of the generator.

A signal generator 311 is switchable by a relay 309. The signal generator 311 can generate a control signal for the ultrasound tool 303. The generating is based here on a small-signal analogous model.

Due to the relay circuit, either the ultrasound generator 301 can be connected to the vibration system, or the signal generator 311, here an amplifier of the analysis system, can be connected to the vibration system. This occurs by the positive pole of the line, that is, the signal path, being disconnected and then connected to the various relay switches.

In another form, the vibration system can be short-circuited between the switching processes that connect the vibration system to the ultrasound generator 301 or to the signal generator 311, by closing a discharge switching element 313 for a plurality of milliseconds, so that any residual charge present in the ultrasound tool 303 can flow off. This inhibits short-term current spikes to the ultrasound generator 301 and to the small-signal controlling as soon as they are again connected to the vibration system.

The relay circuit and also the modified sine are controlled or generated software-side. The timing for the switching of the respective circuit elements 307, 309, 313 of the relay circuit is affected via process observation. The initial state is the observing of the welding. In this regard the circuit elements—depending on the desired power, a plurality thereof connected in parallel—are closed, so that the ultrasound generator 301 is connected to the ultrasound tool 303.

When the welding begins, a trigger is activated, and the software detects the start and end of the welding and saves the measured voltage and current profiles for the subsequent evaluation. After completion of the weld, the process pause is used and the software switches from "generator ultrasound vibrator" to "short circuit ultrasound vibrator" to "small-signal ultrasound vibrator." That is, the circuit component 307 cuts the signal path, the circuit element 313 generates a short-circuit for a short time to allow residual charge to flow off, and then opens again and the circuit element 309 then switches on the signal generator 311, so that it can provide a control signal for the ultrasound tool 303.

Now the modified sine is overlapped by the signal generator 311 onto the ultrasound tool 303, wherein the duration is a plurality of seconds down to less than 1 second, depending on the pauses in the process. After completion of the impedance measurement, the software switches the circuit elements 309, 313, 307 in reverse sequence back to their initial state and connects the ultrasound generator 301 to the ultrasound tool 303.

The switching and evaluation take place in an evaluation device 315, a microcontroller here. Measurement of the electrical control signal, regardless of whether it comes from the ultrasound generator 301 or from the signal generator 311, is affected via a sensor device 316 which comprises a voltage meter 317, in particular a voltage sensing head, and a current transformer 319, which allows a non-invasive measurement of the current.

Figure 4:
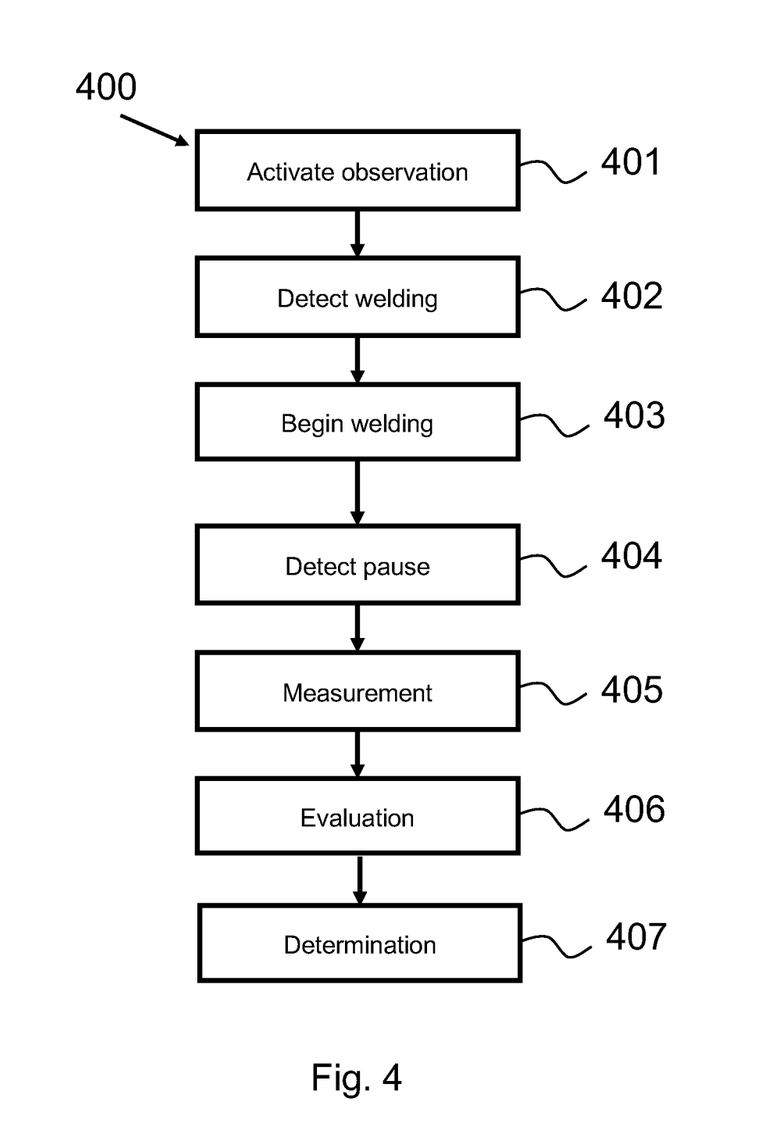
FIG. 4 shows a flow chart for a method according to one form of the present disclosures.

FIG. 4 shows a flow chart 400 for a method according to one form.

In a first step 401, a transparent observer mode is assumed. That is, the switching element 307 is switched such that the ultrasound generator 301 can provide the electrical control signal for the ultrasound tool 303.

In a second step 402, a welding is triggered, that is, the evaluation unit detects that a weld process is occurring. This can be affected by a monitoring of the voltage meter 317.

In a step 403, the welding begins. In this case the weld process is observed in a non-invasive manner. For this purpose, a current is measured via the transformer 319 and the voltage is measured on the voltage meter 317.

In step 404, there is a pause in the weld process, which is detected as described in 402.

In step 405, subsequently an impedance measurement is conducted, and next a switch back to the transparent observer mode occurs in order not to hinder the welding.

In parallel to this, in step 406 the measured result of the impedance measurement is evaluated and thus a signal characteristic is determined. In this regard the evaluation unit 315 determines a derivation of indicators for assessment of the weld quality, replacement parameters and initiates a characterization of the US vibration system 300. In one form, a step 406 takes place following the step 405.

In step 407, a state of the ultrasound welding process is determined based on a reference signal profile and on the signal property determined by the evaluation unit 315. In this case the reference signal profile is defined as a target value and compared to whether the determined signal property is located in a predefined area around the target value.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "evaluation unit," "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A device to determine a state of an ultrasound welding process using an ultrasound tool, the device comprising:
    a sensor device configured to detect an electric control signal of the ultrasound tool;
    an evaluation unit configured to:
        determine a signal property of the electric control signal; and
        determine the state of the ultrasound welding process based on a reference signal profile and on the determined signal property;
    a first connection configured to be connected to an output of an ultrasound generator;
    a second connection configured to be connected to a signal input of the ultrasound tool;
    a signal path electrically connecting the first connection and the second connection, wherein the sensor device is configured to measure the electric control signal along the signal path;
    a switching element disposed in the signal path and configured to interrupt the signal path to electrically separate the first connection from the second connection; and
    a signal generator configured to generate a control signal for the ultrasound tool and to control the ultrasound tool when the switching element interrupts the signal path.

2. The device according to claim 1, wherein the switching element is configured to interrupt the signal path when the sensor device detects that the ultrasound generator is not sending any control signal to the ultrasound tool.

3. The device according to claim 1, wherein the signal generator is further configured to generate the control signal for the ultrasound tool, wherein the control signal is generated based on an equivalent circuit.

4. The device according to claim 1, wherein the sensor device is further configured to measure an electrical signal on the signal path, while the signal generator of the device controls the ultrasound tool via the signal path.

5. The device according to claim 4, wherein the evaluation unit is further configured to determine replacement parameters based on the measured electrical signal, while the signal generator of the device drives the ultrasound tool via the signal path.

6. The device according to claim 1, wherein the signal generator is further configured to generate the control signal based on an operating signal of the ultrasound generator.

7. The device according to claim 6, wherein the operating signal is at a frequency between ±2 kHz of an operating frequency of the ultrasound generator.

8. The device according to claim 1, further comprising a discharging circuit element electrically connected to the signal path and configured in a conducting state to short-circuit the ultrasound tool so that a residual charge in the ultrasound tool can flow off.

9. The device according to claim 1, wherein the sensor device comprises at least one of a voltage meter to measure a voltage signal and a current transformer to measure a current signal.

10. An assembly with an ultrasound welding system and the device according to of claim 1, wherein the device is connected between the ultrasound generator of the ultrasound welding system and the ultrasound tool of the ultrasound welding system.

11. A method to determine a state of an ultrasound welding process, the method comprising:
    measuring an electrical control signal of an ultrasound tool using a sensor device;
    determining of a signal property of the control signal using an evaluation unit;
    determining a status of the ultrasound welding process based on a reference signal profile and on the signal property determined by the evaluation unit;
    disconnecting an ultrasound generator from the ultrasound tool by a switching element;
    generating a control signal by a signal generator; and
    controlling the ultrasound tool when the ultrasound generator is disconnected from the ultrasound tool.

12. The method according to claim 11, further comprising determining a replacement parameter for a welding system based on a particular status of the ultrasound welding process based on the generated control signal.

* * * * *